(12) United States Patent
Rodov et al.

(10) Patent No.: US 6,186,408 B1
(45) Date of Patent: Feb. 13, 2001

(54) HIGH CELL DENSITY POWER RECTIFIER

(75) Inventors: Vladimir Rodov, Redondo Beach; Wayne Y. W. Hsueh, San Jose; Paul Chang, Saratoga; Michael Chern, Cupertino, all of CA (US)

(73) Assignee: Advanced Power Devices, Inc., San Jose, CA (US)

( * ) Notice: Under 35 U.S.C. 154(b), the term of this patent shall be extended for 0 days.

(21) Appl. No.: 09/322,269

(22) Filed: May 28, 1999

(51) Int. Cl.$^7$ .................................................. H01L 21/336
(52) U.S. Cl. ............................................ 238/268; 257/328
(58) Field of Search ..................... 438/268, 212, 438/209, 206; 257/328

(56) References Cited

U.S. PATENT DOCUMENTS

| | | |
|---|---|---|
| 4,903,189 | 2/1990 | Ngo et al. . |
| 4,967,243 | 10/1990 | Baliga et al. . |
| 5,111,253 | 5/1992 | Korman et al. . |
| 5,504,359 | * 4/1996 | Rodder .................................. 257/329 |
| 5,610,085 | 3/1997 | Yuan et al. . |
| 5,825,079 | 10/1998 | Metzler et al. . |
| 5,874,760 | 2/1999 | Burns, Jr. et al. . |
| 6,097,046 | * 8/2000 | Plumton ............................... 257/266 |

FOREIGN PATENT DOCUMENTS

4121052A1 * 1/1993 (DE) .

OTHER PUBLICATIONS

"Synchronous Rectification" Synchronous Rectification Improves With Age PCIM Aug. 1998 Bob Christiansen, Samsung Semiconductor, San Jose, California.

"Improved MOSFET" An Important Milestone Toward a New Power MOSFET Generation PCIM Sep. 1998 L. Lorenz M. Maerz and G. Deboy, Siemens AG, Munich, Germany.

* cited by examiner

*Primary Examiner*—Olik Chaudhuri
*Assistant Examiner*—Douglas A. Wille
(74) *Attorney, Agent, or Firm*—Myers, Dawes & Andras LLP

(57) ABSTRACT

A power rectifier having low on resistance, fast recovery times and very low forward voltage drop. In a preferred embodiment, the present invention provides a power rectifier device employing a vertical device structure, i.e., with current flow between the major surfaces of the discrete device. The device employs a large number of parallel connected cells, each comprising a MOSFET structure with a gate to drain short via a common metallization. A self aligned body implant and a shallow silicide drain contact region integrated with a metal silicide drain contact define a narrow channel region and allow very high cell density. This provides a low $V_f$ path through the channel regions of the MOSFET cells to the contact on the other side of the integrated circuit. The present invention further provides a method for manufacturing a rectifier device which provides the above desirable device characteristics in a repeatable manner. Also, only two masking steps are required, reducing processing costs.

18 Claims, 9 Drawing Sheets

HIGH CELL DENSITY POWER RECTIFIER

BACKGROUND OF THE INVENTION

1. Field of the Invention

The present invention relates to discrete semiconductor devices and in particular to power semiconductor devices. More particularly, the present invention relates to power rectifiers including semiconductor diodes, Schottky diodes and synchronous rectifiers.

2. Background of the Invention

Power rectifiers have a variety of applications. For example, an important application of such rectifiers is in DC to DC voltage converters and power supplies for personal computers and other electronic devices and systems. In such applications, it is important to provide both a fast recovery time for the semiconductor rectifier and a low forward voltage drop across the rectifier ($V_f$).

The most common rectifiers are semiconductor diodes, i.e., diodes which employ a PN semiconductor diode junction for rectification. While it is possible to adjust the properties of the diode junction to increase the recovery speed of the diode or to reduce the $V_f$ of the diode, it is typically impossible to simultaneously lower both the voltage drop across the diode and at the same time decrease the recovery time of the diode in the frame work of a given physical model and a given fabrication method.

In other applications of power rectifiers such a compromise of $V_f$ or speed is not possible. For example, current high performance PCs are reaching clock speeds in the GHz range. Also, the logic levels in such leading edge PCs operate at low voltages; for example, two volts or even one volt. Therefore, the bus lines and clock lines on the motherboards of such current high performance PCs carry GHz signals at one or two volt levels. The edges of these clock and bus lines will therefore radiate at RF frequencies, potentially creating a variety of interference problems. One approach to circumventing this problem is to shield the radiation sources, typically involving shielding the entire motherboard so as to avoid any RF leaks. This not only adds cost to the manufacturing of the PC but also creates undesirable weight, which is especially undesirable for portable computers. In addition, shielding does not prevent potential interference inside of enclosure.

The most desirable solution to such RF radiation problems from high performance PCs is to clamp the bus and clock lines to ground using a rectifier. However, for GHz frequencies and voltage levels under two volts, diode rectifiers are unable to provide both the needed speed and very low $V_f$ to function as clamping rectifiers.

Other approaches to power rectifiers are also unable to meet this need. For example, Schottky diodes provide some advantages over pn junction diodes since Schottky diodes have a lower $V_f$ for a given recovery time than semiconductor diodes. Nonetheless, such Schottky rectifiers suffer from problems such as high leakage current and reverse power dissipation. Also, these problems increase with temperature causing reliability problems for power supply applications. Also, Schottky diodes are typically more expensive than semiconductor junction diodes due to yield problems. The degree of optimization of the compromise between $V_f$ and reverse recovery time is limited by available set of Schottky Barrier generating metals. It becomes clear that Schottky technology can not satisfy very high speed and very low $V_f$ required by modern applications.

Synchronous rectifiers have also been designed which avoid some of the problems associated with both Schottky diodes and PN junction diodes for high speed low voltage applications. The current state of such approaches to synchronous rectifiers for high performance rectifier applications is described, for example, in Bob Christiansen, et al. "Synchronous Rectification", *PCIM,* August 1998. However, currently available synchronous rectifiers are also unable to provide the speed and low $V_f$ levels needed for such GHz, low voltage clamping applications. Due to the fact that a synchronous rectifier is in fact a combination of a Power MOSFET and a complex IC, controlling the Power MOSFET, it may not be possible even in principal to build circuits fast enough to be capable of effective clamping of computer buss lines In view of the foregoing, it will be appreciated that none of the existing commercially viable power rectifiers provide all the desirable characteristics needed for applications where both very low $V_f$ and very fast recovery are needed, such as, for example, low voltage GHz clamping applications in high performance PCs or very high frequency low voltage DC to DC voltage converter applications. Therefore, a need presently exists for a power rectifier device having low on resistance, low $V_f$, high speed switching capabilities as well as controllable device characteristics. Furthermore, it will be appreciated that a need presently exists for such a device which is not unduly complex, which is readily compatible with available integrated circuit processing techniques and which may be produced at low cost.

SUMMARY OF THE INVENTION

The present invention provides a power rectifier device having, fast recovery time and very low forward voltage drop. The present invention further provides a method for manufacturing such a rectifier device which is compatible with existing semiconductor technology, which provides a high degree of reliability in device characteristics and which can provide such devices at reduced cost.

In a preferred embodiment, the present invention provides a discrete power rectifier device employing a vertical device structure, i.e., with current flow between the major surfaces of the discrete device. The device employs a large number of parallel connected cells, each comprising a MOSFET structure with a gate to drain short via a common conductive layer. A precisely controlled body implant and a very shallow drain region define a narrow channel region. A metal silicide drain contact merges with the drain region and provides a low resistance electrical contact. This combination provides a very low $V_f$ path through the channel regions of the MOSFET cells to the source region on the other side of the integrated circuit. This combination also allows very high cell density and controllable device characteristics.

In a further aspect, the present invention provides a method of fabricating a high cell density rectifier device employing relatively few masking steps and which may be implemented at relatively low cost. In a preferred embodiment, the method employs forming a large number of pedestals on the top surface of a semiconductor substrate which pedestals are used to align the structures forming the active cells. A thin gate oxide layer is formed on the substrate adjacent to the pedestals. A first spacer, preferably of polysilicon, is then formed on the gate oxide adjacent the pedestal sidewalls. This is followed by a first implant into the semiconductor substrate, which implant is laterally defined by the first spacer, to form a body region. The first spacer is then removed. A thin metal gate layer is then formed on top of the gate oxide. A second thicker spacer, preferably also of polysilicon, is then formed adjacent the pedestal sidewalls. The metal and oxide layers between the spacers are then etched to the silicon substrate. A second metal layer is then formed over the second spacer and the exposed substrate followed by a second implant of a dopant of a second conductivity type, laterally defined by the second spacer, into the second metal layer. A thermal processing step is then employed to diffuse the dopant into the substrate to form a shallow drain region and to form a metal suicide drain contact which merges with the shallow drain region. Narrow channel regions adjacent the pedestals and below the gate oxide are defined by the shallow drain region and the body implant. First and second electrical contact metallization layers are then formed on the top and bottom surfaces of the substrate, to create a vertical device structure with a current flow path between the surfaces. Since the channel regions are defined by the use of two spacers both referenced to the pedestal sidewalls in a self aligned manner, and due to the very shallow drain and metal silicide drain contact, the channel dimensions and dopant levels may be precisely controlled despite inevitable process variations. Also, only two masking steps are required providing significant cost advantages. An optional third masking step may be employed to form guard ring and plug regions.

In a further aspect of the present invention, a clamping circuit is provided for high frequency clock or bus lines in computer motherboards or other applications. A very fast low $V_f$ rectifier, as described above, is used to clamp the clock or bus lines to ground at points where the lines tend to emit radiation in the form of high frequency RF signals. In particular, the clamping circuit is provided at termination points of the clock or bus line, typically at the edges of a circuit board, where such RF radiation may be generated. This clamping circuit substantially eliminates such RF radiation reducing the need for shielding and associated costs and weight.

Further features and advantages of the present invention will be appreciated by review of the following detailed description of the invention.

DETAILED DESCRIPTION OF THE INVENTION

Figure 1A:
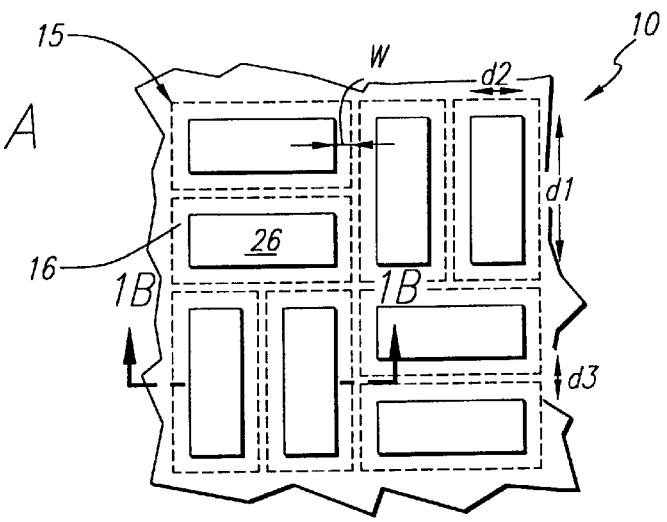
FIG. 1A is a top view of a portion of the power rectifier device of the present invention.
Figure 1B:
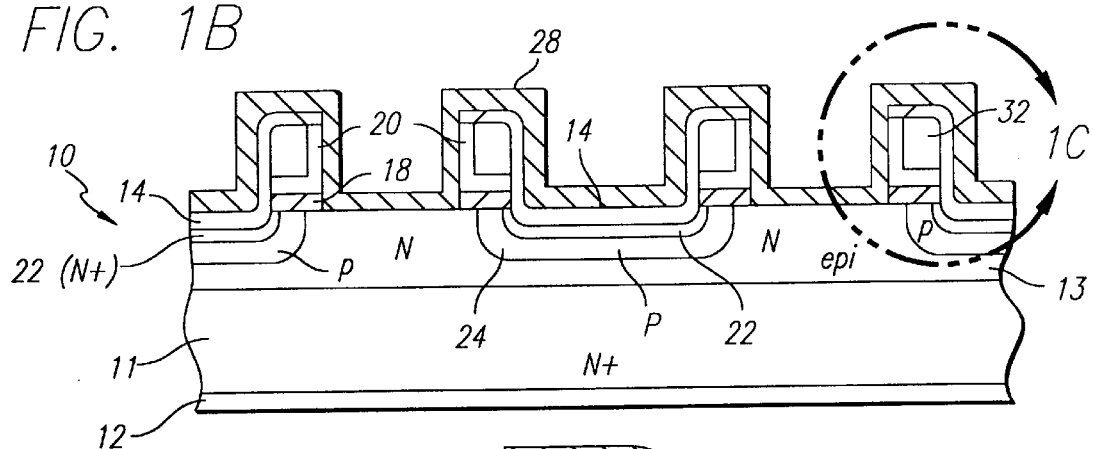
FIG. 1B is a side sectional view of a portion of the power rectifier device shown in FIG. 1A.

Referring to FIGS. 1A and 1B, the structure of the power rectifier device 10 of the present invention is illustrated in top and side sectional views, respectively. The rectifier of the present invention is a vertical device with current flowing between the top and bottom major surfaces of the integrated circuit (IC) to provide the desired high current capacity needed for applications such as clamping circuits, voltage converters and power supplies. The current flow is thus between the source contact 12 configured on the bottom surface of the integrated circuit substrate 11 shown in FIG. 1B and the drain contact 14 configured on the top major surface of the substrate.

The device 10 includes a plurality of parallel connected active regions or cells 15, shown in FIG. 1A, which form a repeating pattern which covers substantially all of the top surface of the device 10 (e.g., 80% or more). A very large number of separate cells 15 are preferably provided, for example, from a fractional number to many millions of cells 15 may be provided. In a presently preferred embodiment, up to 100 million cells/cm$^2$ are provided. The cells 15 have a rectangular shape and are arranged in alternating pairs. For example, each cell may have a length dimension $d_1$ of about 1.0–1.5 microns and a width dimension $d_2$ about 0.25–0.50 microns. (The noted distances denote distances between the inner channel boundaries of a cell.) Although a large number of separate cells 15 are presently preferred, in some cases it may be desirable to enlarge the area of individual cells to form different geometries with fewer cells. For example, elongated rectangular cells having a greatly enlarged length direction $d_1$ stretching over a substantial portion of the width or length of the top surface of the chip may be provided. It will be appreciated, also, that alternate geometries may be employed including various multi-sided shaped cells. In any case, it is desirable to minimize the distance $d_3$ between the individual cells 15 to maximize the current carrying area; for example, in accordance with the presently preferred embodiment of the device 10 the distance $d_3$ between cells is on the order of 0.25 microns. (This distance is between inner channel boundaries of adjacent cells.) In general, the distance $d_3$ is desired to be below one micron.

Figure 1C:
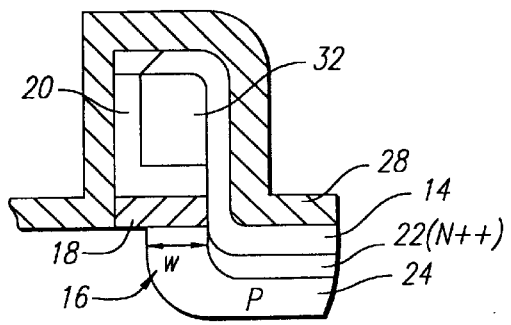
FIG. 1C is an expanded view of a portion of the structure shown in FIG. 1B.

The active cells 15 are preferably formed in an epitaxial layer 13 situated above a more heavily doped semiconductor substrate 11. As shown in FIGS. 1A, 1B and 1C, each cell 15 includes a channel region 16 having a width W. The channel width is preferably very narrow, e.g., about 200–1500 Å. The current flows from the drain contact 14 to drain region 22 passing through the annular channel regions 16, epitaxial region 13, substrate 11 and finally through the source contact 12. A gate oxide 18 and gate electrode 20 are configured over each channel region 16. The gate electrode 20 controls the current flow through the channel 16. As shown in FIGS. 1B and 1C, gate 20 is shorted to the drain contact 14 which is formed over drain region 22. At least a portion of the drain contact 14 comprises a metal silicide formed by thermal processing of a drain contact metal in contact with the underlying silicon substrate, as will be discussed in detail below. This provides a very effective contact between drain contact 14 and drain region 22. Also, the drain region is preferably a very shallow highly doped region implanted and/or diffused through the drain contact 14 into the substrate 13. As also shown, a buried body region 24 is provided under the drain contact region 22.

Figure 1D:
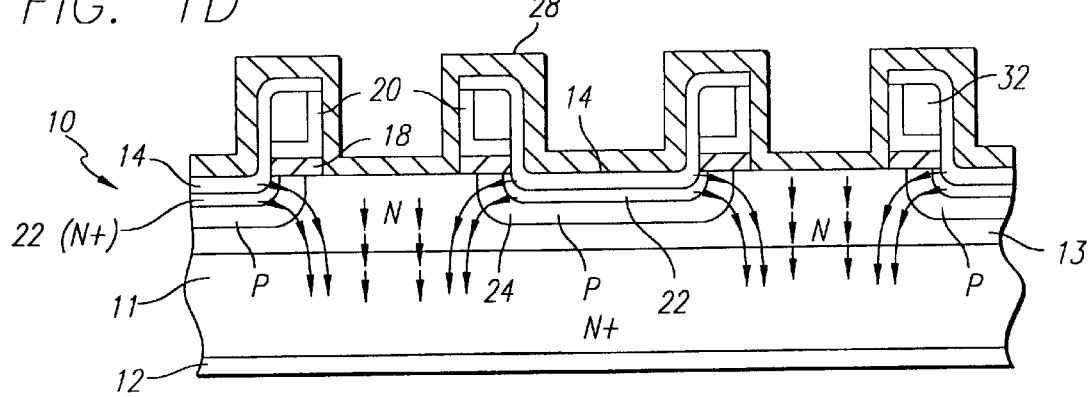
FIG. 1D is a drawing of the structure shown in FIG. 1B illustrating the current flow path through the top portion of the device.

It will therefore be appreciated that the general device structure of each cell may be viewed as a MOSFET with gate to drain shorted and with a generally horizontal current flow through the channel regions 16, but an overall vertical current flow, as shown in FIG. 1D. MOSFET structures which are actively driven so as to act as rectifiers are referred to in the art as active synchronous rectifiers while MOSFET devices employing a gate to drain short can be referred to as "passive synchronous rectifiers". Therefore, the device of the present invention may be viewed as a "passive" synchronous rectifier in terms of its general electrical mode of operation. Although the device is illustrated as an N channel device it may also be provided as a P channel device and the appropriate N to P substitutions are to be understood in the Figures for such a P channel embodiment. Also, the rectifier device may be provided as either an enhancement or depletion mode device. In the later case an additional Ion Implantation step might be needed for the corresponding threshold adjustment.

As may be best appreciated from FIG. 1C, the width W of channel 16 is defined, under the gate oxide 18, by the drain region 22 and the P type body region 24. Due to the very shallow drain region 22, the outer edge of the channel is effectively defined by the edge of the metal silicide drain contact 14. This allows a very precise and narrow channel 16. Also shown in FIG. 1C is a residual region 21 of metal which is not converted to silicide since it is on top of metal gate 20.

As will be further appreciated from inspection of FIG. 1C, the present invention employs a thin gate 20. In particular, the gate 20 may be formed from a thin metal layer having a thickness of from 100–250 Å in a presently preferred embodiment. The metal may be chosen from conventional gate metals; for example, Ti is presently preferred but Mo or Ni may also be employed as well as other metals known in the art. Region 32 in turn is an artifact of the self aligned double spacer process used to define the channel region of the device and comprises a doped or implanted polysilicon layer to provide good electrical contact between the gate 20 and the drain contact layer 14. Also, as mentioned above and described in more detail below, at least part of the drain contact 14 comprises a silicide formed from the metal of contact layer 14 and the underlying silicon in drain region 22. This silicide region also partially penetrates polysilicon region 32 further enhancing the electrical contact with the gate 20 providing good contact even for very thin gate structure. Alternatively, polysilicon region 32 may be removed and a direct contact between gate 20 and metal 14 provided.

The rectifier device 10 also may include a number of Schottky diode regions 26 in parallel with the MOSFET cells 15. In such an embodiment, a Schottky diode region 26 is preferably provided for each cell 15. These provide a parallel current flow path, illustrated by the dashed arrows in FIG. 1D. The Schottky diode junction is formed by a Schottky metallization layer 28 which contacts the substrate 13 as best shown in FIG. 1B. As shown in FIG. 1A, the plurality of Schottky diode regions 26 are configured within the annular channel regions 16 and therefore a portion of the Schottky diode region is adjacent the parasitic body diode formed by the boundary between the N type epi region 13 and P type region 24 of each MOSFET cell. The barrier height of the Schottky diode junction formed in regions 26 is small, therefore, the parallel Schottky structure reduces carriers injected by the parasitic diodes adjacent the channel regions, reducing the recovery time of the device. This allows the recovery time of the rectifier of the present invention to be as low as Schottky diode rectifiers, e.g., about 10 ns. Nonetheless, the detrimental features of Schottky diodes are avoided since the primary current flow path is via the MOSFET cells. Recovery speed of the MOSFET cells 15 may approach or surpass that of the Schottky diodes for high cell density very narrow channel embodiments, however, in which case it may be preferable to dispense with the Schottky regions 26. Such an embodiment is described below.

Figure 2A:
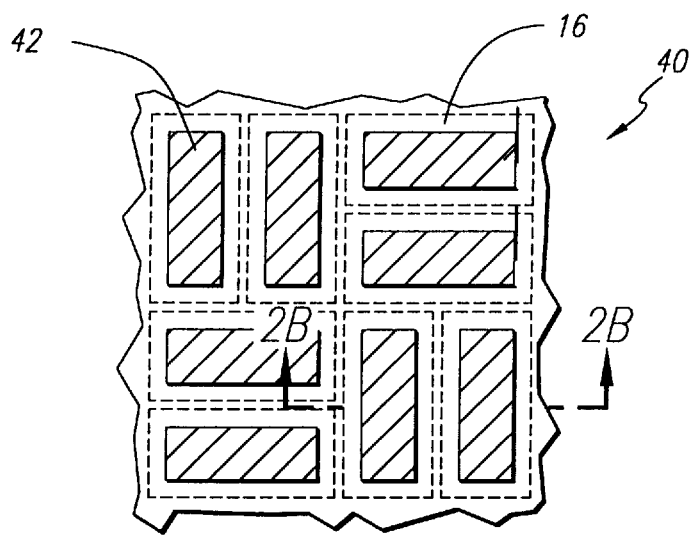
FIG. 2A is a schematic drawing of an alternate embodiment of the power rectifier device of the present invention.
Figure 2B:
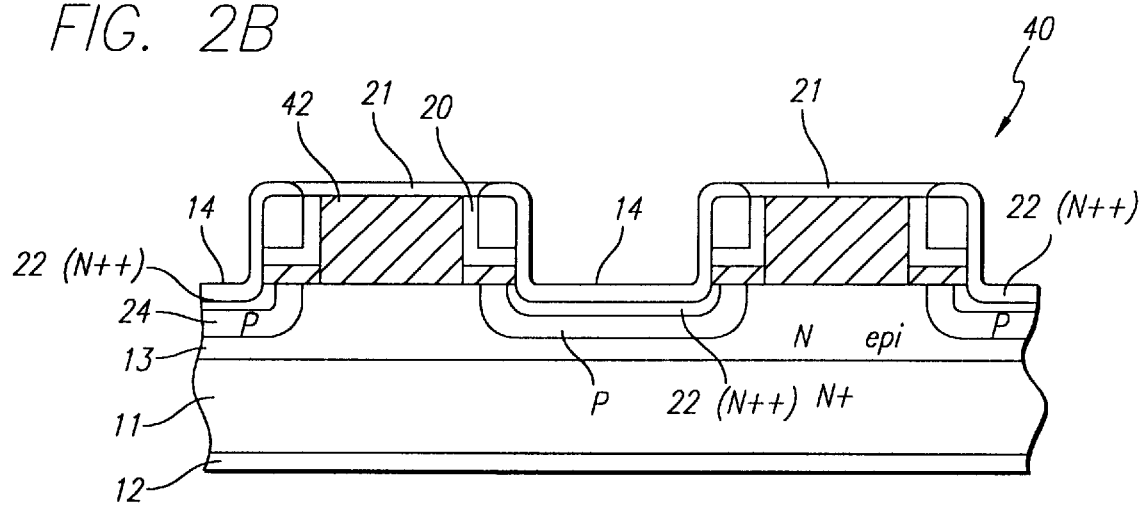
FIG. 2B is a side sectional view of the portion of the power rectifier device shown in FIG. 2A.
Figure 2C:
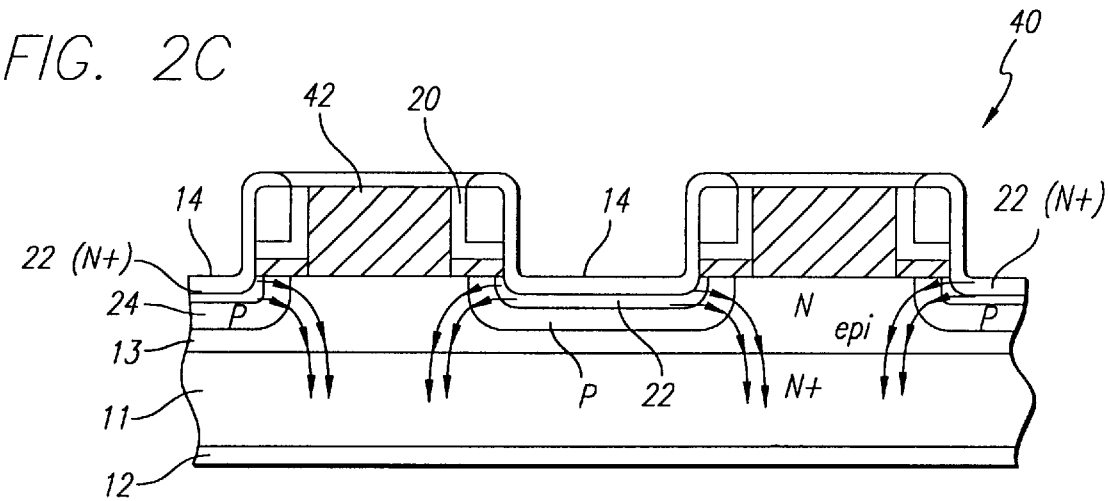
FIG. 2C is a drawing of the structure shown in FIG. 2B showing the current flow path through the top portion of the device.

Referring to FIGS. 2A–2C, an alternate embodiment of the power rectifier device of the present invention is illustrated. The embodiment of FIGS. 2A–2C provides the same MOSFET cell structure as in the previously described embodiment but replaces the parallel Schottky diode structure with a central pedestal region 42 inside the annular channel region 16. The pedestals 42 may comprise silicon dioxide ($SiO_2$) layers which serve to both define and isolate the active regions of the device. In particular, the pedestals are employed in a self-aligned fabrication method of the device as described below, which allows use of a minimal number of masking steps. (This self aligned fabrication method may also be employed for the device of FIGS. 1A–1D as will be discussed below.) Since the structure of the device illustrated in FIGS. 2A–2C is identical to that described previously like numerals are employed. Also, during normal operation, the current flow through the MOSFET cells is the same as in the previously described embodiment as is generally illustrated in FIG. 2C. The absence of the parallel Schottky diode structure is the sole electrical difference between the two embodiments and there may be cost advantages due to reduced processing steps for the device 40 rendering it advantageous to employ the embodiment of FIGS. 2A–2C where the cell density and size provide speeds equal to Schottky diodes.

As illustrated in FIG. 2A, the pedestal regions 42 are spaced apart by a distance D; e.g., approximately 0.25–1.0 microns in a presently preferred embodiment. It will be appreciated, however, that this distance D may decrease with further advances in processing technology. Also, as in the previously described embodiment, the repeating pattern of channel regions may be replaced by elongated cells or with other geometries.

Accordingly, it will be appreciated that the present invention as illustrated provides a low on resistance, fast, and low $V_f$ power rectifier which is easy to manufacture and which has a high degree of reliability in its electrical characteristics despite inevitable process variations. Further advantages of the device illustrated in FIGS. 1A–1D will be appreciated from the. discussion below of a preferred method of manufacture thereof.

Figure 3:
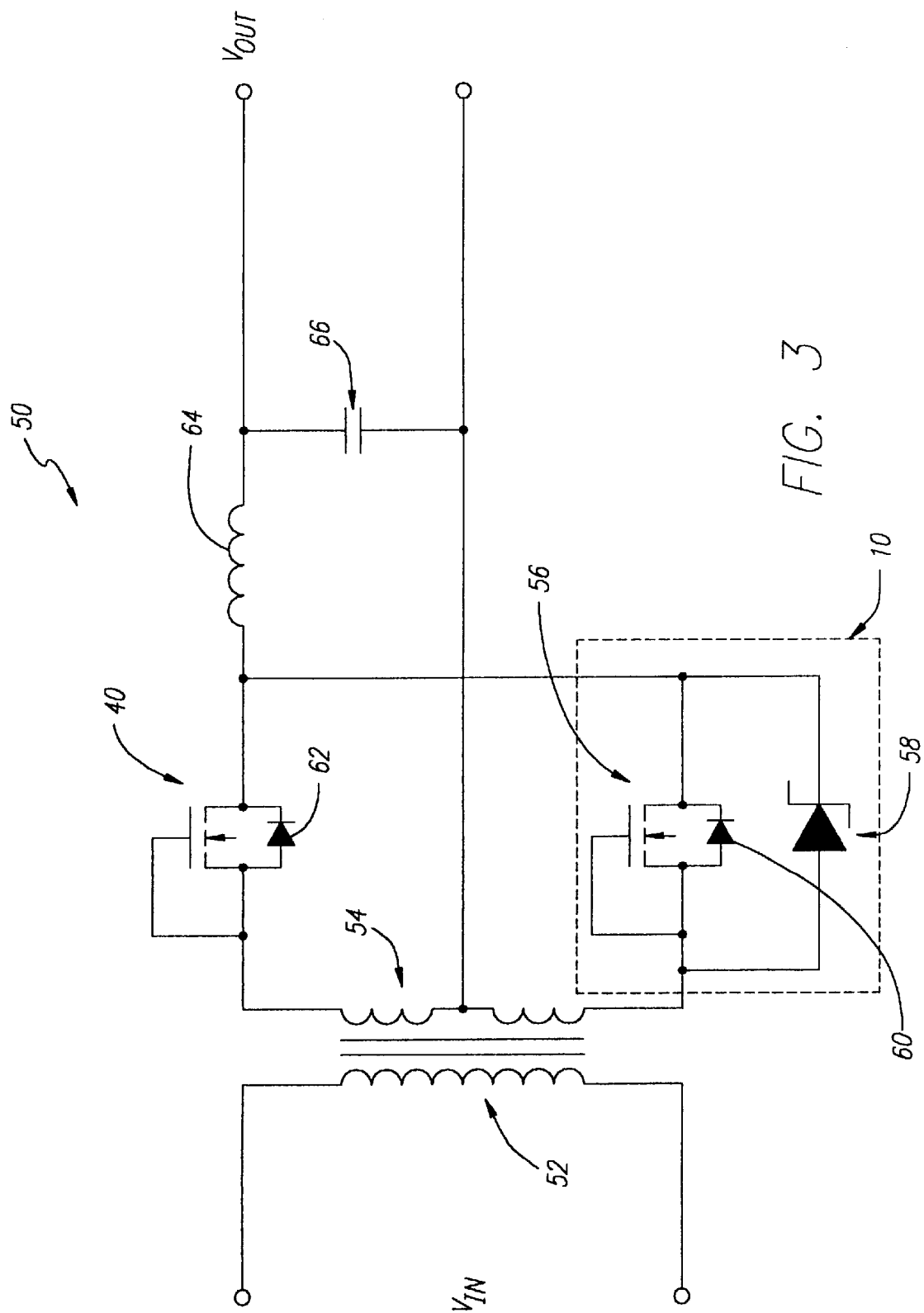
FIG. 3 is an electrical schematic drawing illustrating a voltage converter employing the power rectifier devices of FIGS. 1 and 2.

Referring to FIG. 3, an electrical schematic drawing of a voltage converter employing the power rectifiers described previously is illustrated. The converter receives an input voltage $V_{in}$ and provides an output voltage $V_{out}$ typically having a reduced voltage from $V_{in}$. For example, an input voltage of 5 volts may be provided at $V_{in}$ and an output voltage of 3.5 volts or 1 volt provided at $V_{out}$, since the voltage converter is particularly suited for low voltage applications. The voltage converter illustrated in FIG. 3 may be a DC to DC converter or an AC to DC converter. In the case of a DC to DC voltage converter, switching circuitry is provided between the input voltage terminals to provide a switched $V_{in}$. Additional circuitry in accordance with the particular application may also be employed. For example, a voltage regulator may be incorporated to provide a regulated voltage to $V_{in}$.

Still referring to FIG. 3, the voltage converter employs a transformer including first and second windings 52, 54, respectively, chosen to provide the desired voltage conversion. The AC output of the secondary winding 54 is provided through first and second rectifiers 10, 40 to provide a DC output $V_{out}$. As indicated by the reference numerals 10 and 40, the rectifiers may preferably correspond to the rectifier devices of FIGS. 1A–1D and 2A–2C described previously. As indicated by the symbols in FIG. 3, the rectifier 10 may be electrically represented as a MOSFET 56, with the gate to drain shorted, configured in parallel with a Schottky diode 58. The parasitic diode in the MOSFET structure is also illustrated as reference numeral 60 in FIG. 3. Similarly, the rectifier 40 is electrically represented as a gate to drain shorted MOSFET, with the parasitic diode indicated at 62. An appropriate level of dopant concentration of body layer 24 provides for desired electrical characteristics of rectifier 40. As also illustrated in FIG. 3 an LC circuit including an inductor 64 and a capacitor 66 may be provided to smooth the output of the rectifiers 10, 40.

In view of the foregoing discussion of the operation of rectifiers 10 and 40, it will be appreciated that the voltage converter circuit illustrated in FIG. 3 has significant advantages over the prior art in a variety of applications, in particular, low voltage power supplies and DC to DC converter applications for electronic devices. For example, as described above, the rectifiers 10 and 40 have low $V_f$ and low on resistance providing desirable advantages in applications involving low voltages. In particular, the heat generated from the diodes 10 and 40 as well as the power lost through such heat generation will typically be less for the circuit of FIG. 3 than prior art devices incorporating prior art discrete diodes. Also, the rectifier 10 includes a parallel Schottky diode 58 incorporated as part of the same integrated circuit as the rectifier, providing the speed advantages described above. Further features and advantages of the voltage converter circuit of FIG. 3 will be appreciated by those skilled in the art.

While the schematic drawing of FIG. 3 illustrates diode 40 as depletion mode N channel devices, it will be appreciated that rectifier 40 may also be implemented as enhancement mode devices or as P channel enhancement or depletion mode devices. Such implementations may be preferred for the needs of a particular application. Accordingly, the schematic drawing of FIG. 3 should be viewed as incorporating each of these alternate embodiments of rectifiers. Also, the rectifier 10 may be employed for both rectifiers in the circuit or the rectifier 40 may be employed for both rectifiers.

Referring to FIGS. 4A–4L, the process flow for a preferred embodiment of method of manufacturing a power rectifier device in accordance with the present invention is illustrated in a series of schematic sectional drawings. FIGS. 4A–4K illustrate a portion of the wafer as it is processed, the illustrated portion generally corresponding to the small portion of a single device illustrated in FIGS. 1B and 2B. It will of course be appreciated that in practice the structure as shown in the figures is repeated many times over the surface of the wafer in which multiple dies are processed together.

Figure 4A:
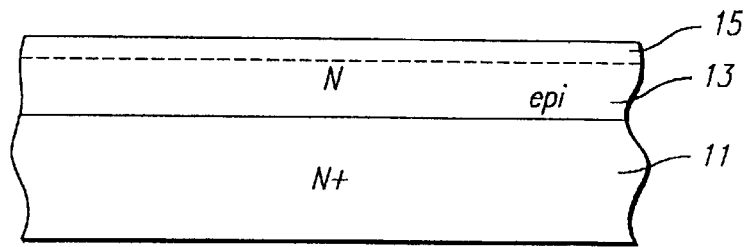
FIGS. 4A–4N are sectional schematic drawings illustrating the preferred method of fabricating the power rectifier devices illustrated in FIGS. 1A–1D and 2A–2C.

Referring first to FIG. 4A, an epitaxial region 13 is formed on substrate 11 in a conventional manner. The process flow will be illustrated for an N channel device and, accordingly, the epitaxial region 13 is shown as N type having, for example, As concentrations in the range of $10^{14}$ to $10^{16}$ cm$^{-3}$. If a P channel device is desired, the dopant will be P type instead of N type and it is to be understood herein that all such doped regions may simply be reversed from N to P type and P to N type to create a P channel device and such is implied for each of the following process steps.

An optional N type region 15 of higher concentration may also be provided to tailor the threshold voltage of the channel regions. Region 15 may be implanted to increase the dopant concentration levels or increased dopants may be introduced during the final growth of the epitaxial layer 13 to provide the desired increased concentration levels. The region 15 may in particular be desired if the device is operated in the depletion mode. For convenience of illustration the region 15 will be suppressed in the remaining drawings but it is to be understood that in appropriate cases, the layer 15 may be present as an upper layer of epitaxial region 13.

Figure 4B:
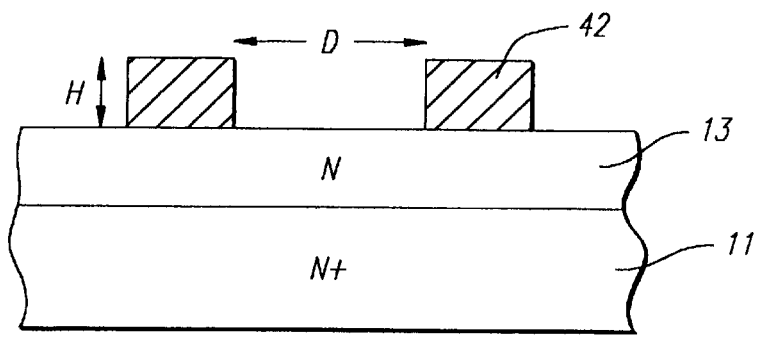

Referring to FIG. 4B, in the next stage of the process, a plurality of pedestal regions 42 are formed on the surface of the epitaxial layer 13. Pedestals 42 form the basic layout (pattern) for the active regions (or cells) and have a repetitive structure corresponding to the desired cell layout described above in relation to FIGS. 1A and 2A. Formation of the pattern of the pedestals represents the first necessary masking step in the process flow of the present invention. (In an optional embodiment described below, a prior masking step may be employed to lay out guard rings and plug regions at the edge and interior regions of the chip.) Pedestals 42 may preferably be formed of any electrically isolating materials commonly used in IC manufacturing (e.g., $SiO_2$, $Si_3N_4$, CVD Oxide, etc.) and may be grown or deposited in a conventional manner. The pedestals are spaced apart a distance D which may, for example, be about 0.25–0.5 microns and about 0.25 microns in a presently preferred embodiment. It will be appreciated that this distance may be greater or less depending on the layout geometry of the cells and also may be reduced as future technological advances allow semiconductor structures of smaller size to be created while retaining the desired control of device characteristics. The pedestals have a height H. For example, H may be approximately 0.25–1.5 microns, or about 0.25 microns, in a presently preferred embodiment. However, the height may be varied outside this range in accordance with the particular implementation process, the particular application of the device, and/or the semiconductor technology and equipment employed.

Figure 4C:
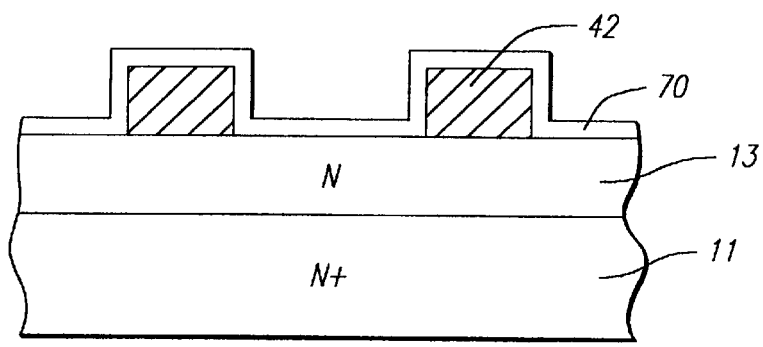

Referring to FIG. 4C, an oxide layer 70 is formed over the surface of the substrate and the pedestals, a portion of which oxide layer will ultimately become the gate oxide 18 discussed above. Preferably, a thin oxide layer is employed to allow more precise control of the threshold voltage of the device. For example, presently an oxide layer thickness of approximately 50 Å is preferred although a range from about 25 to 500 Å may be employed depending on the overall device characteristics desired.

Figure 4D:
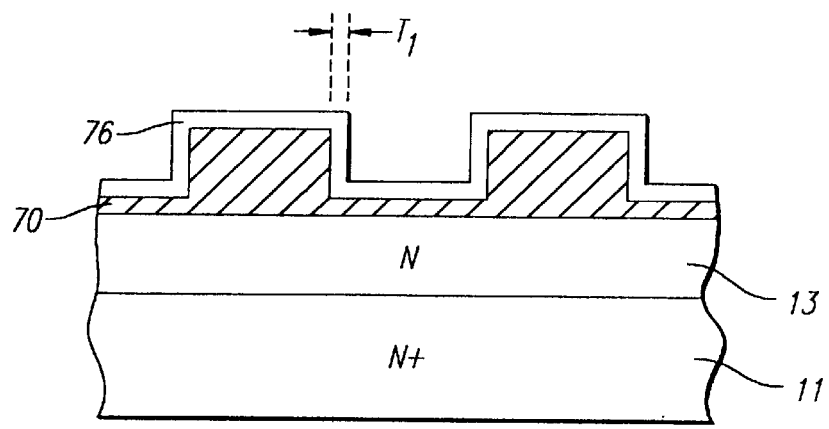
Figure 4E:
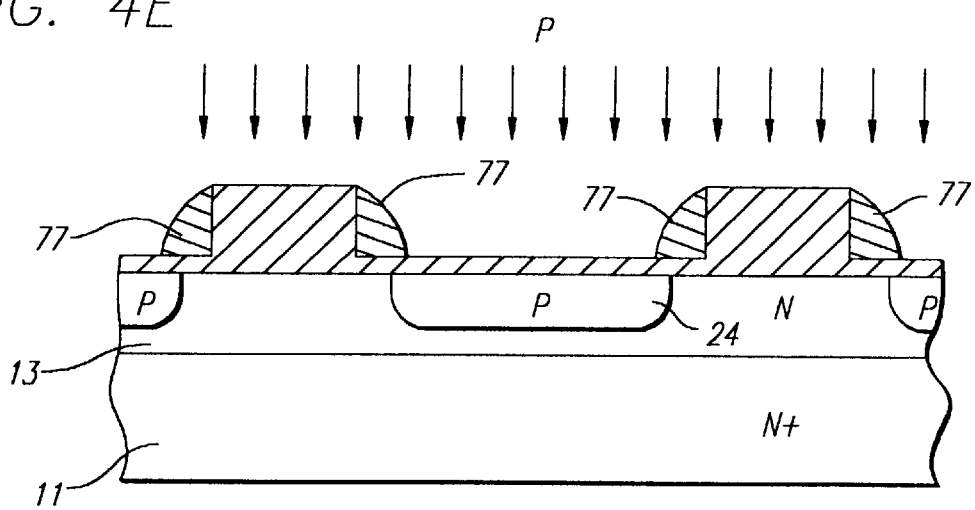

Referring to FIGS. 4D and 4E, the next stage in the process flow is illustrated. As shown in FIG. 4D, a layer 76 is deposited on top of the oxide layer 70. (In FIG. 4D, the oxide layer 70 on top of the pedestal region 42 is suppressed since its functionality does not differ from that of the underlying pedestal region.) An anisotropic etch is then employed to remove part of layer 76, leaving only the portions 77 on the sidewalls of pedestals, as shown in FIG. 4E. As will be appreciated by those skilled in the art, this is the standard spacer formation method. A blank boron implant is then performed to form p-type body region 24 (or using an n-type implant to form n-type region in the case of a p-channel device). Spacers 77 are used to define the implant of the p-type body region 24 without using any photo mask. The spacers 77 are removed after the implant and the material out of which these spacers are made is therefore chosen to be suitable for a simple deposition and subsequent etching removal compatible with the desired process flow. For example, spacer 77 may be a polysilicon spacer deposited through conventional methods. The thickness of the spacer 77 is chosen to define the edge of the P implant and hence one edge of the active channel. For example, in a presently preferred embodiment, the spacer 77 may be approximately 500–1,000 Å or about 500 Å in particular. The implant of the P type body region may range from about $10^{15}$–$10^{18}$ cm$^{-3}$ of a suitable P type dopant such as boron (or N type dopant such as arsenic in the case of an N type body region in a P channel device). Also, some slope will inevitably be present in the sidewalls of the spacer 77 and therefore, it is impossible to precisely control the lateral positioning of the edge of the P implant. Therefore, the spacer 77 is chosen to allow for such uncertainty in the lateral positioning of the edge of the P type body region.

It can be appreciated that the shape of the p-n junction created after this implantation may not be optimal for maximizing breakdown voltage. In such a case it may become necessary to employ additional steps to reshape the junction profile. This task can be accomplished either by multiple implants with different energies after the spacer has been defined or by introduction of one or more "intermediate" spacers for additional implants. In such cases the total dose will determine the peak of p-concentration at the surface and therefore resulting V threshold.

Figure 4F:
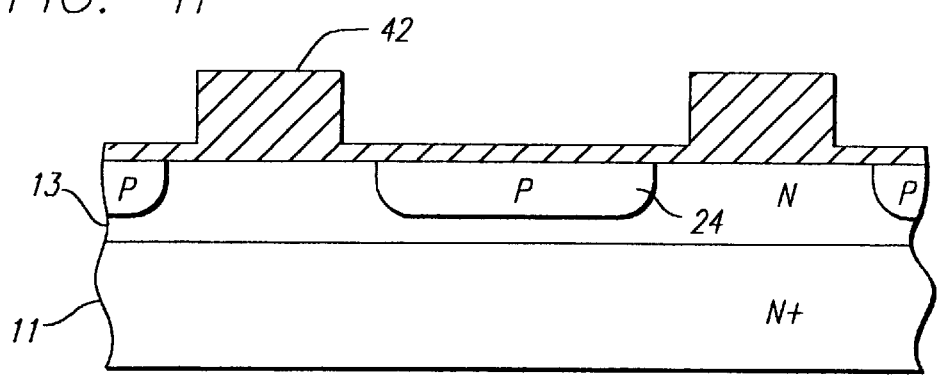

Referring to FIG. 4F, the process flow is illustrated after the first spacers 77 have been removed. As shown, the P type body region 24 is slightly shifted away from the edge of the pedestal 42. Therefore, the edge of the channel region will be similarly displaced from this region and provide better control of device characteristics irrespective of unavoidable variations in pedestal or spacer sidewall formation.

Figure 4G:
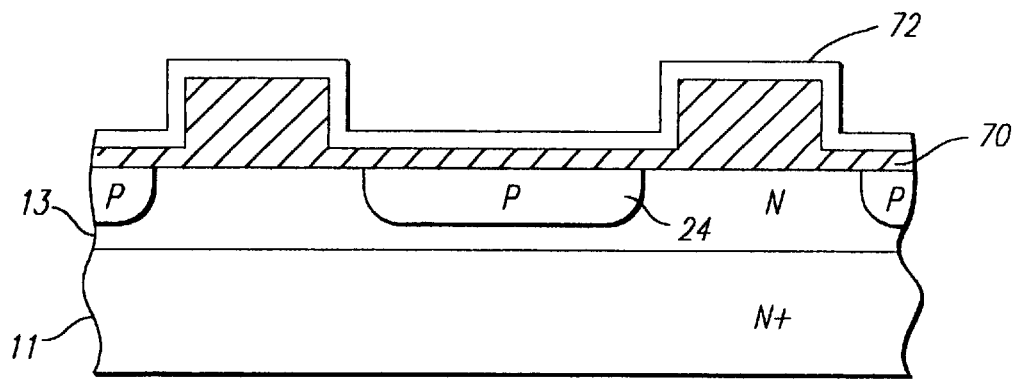

Referring to FIG. 4G, at the next stage of process flow a conductive layer 72 is formed on top of the oxide layer 70. The conductive layer 72 is preferably a thin metal layer of any of a number of suitable metals such as titanium, molybdenum or nickel and may be deposited in a conventional manner. A portion of the conductive layer 72 will ultimately become the gate regions 20 described in the embodiments of FIGS. 1A–1D and 2A–2C. In a presently preferred embodiment, metal layer 72 is relatively thin, for example, from about 100–250 Å. This thin gate layer allows small cell geometries to be maintained without loss of control of gate threshold.

Figure 4H:
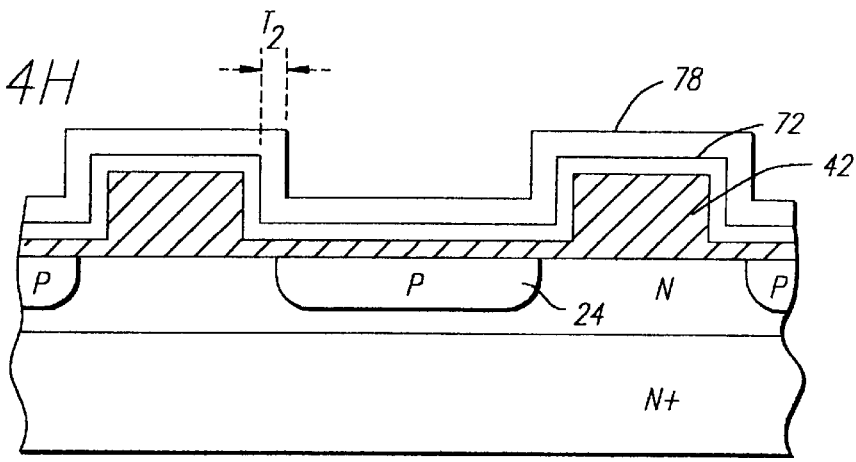

Referring to FIG. 4H, at the next stage in the process flow a second layer 78 is deposited on the conductive layer 72. Layer 78 may be Polysilicon deposited to a controlled thickness $T_2$. The thickness $T_2$ of the spacer generated by the anisotropic etch of the layer 78 is greater than $T_1$ and ensures there is no interference between the surface P concentration corresponding to the P type body region 24 and the highly concentrated N dopant in the drain region. In particular, in a presently preferred embodiment, the thickness $T_2$ of second layer 78 may be approximately 500–2,000 Å.

Figure 4I:
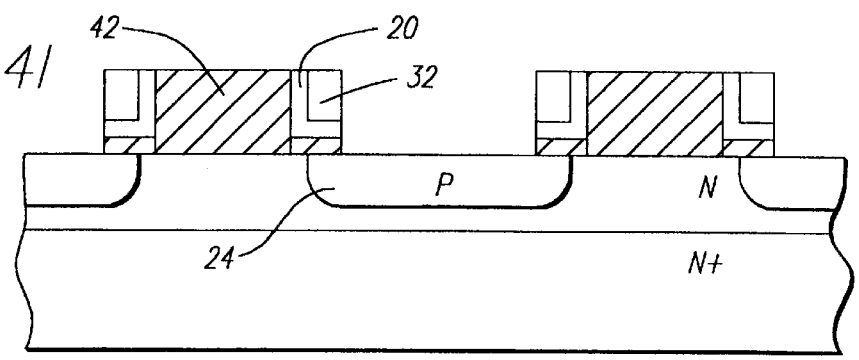

Referring to FIG. 4I, the next stage in the process flow is illustrated corresponding to reactive ion etching or other suitable anistropic etching of the layer 78 to form the composite spacer from spacers 20 and 32. This spacer formation etch preferably proceeds all the way down to expose the underlying silicon surface over a portion of the P type body region 24 as shown in FIG. 4I. The residual second spacer is indicated at 32.

Figure 4J:
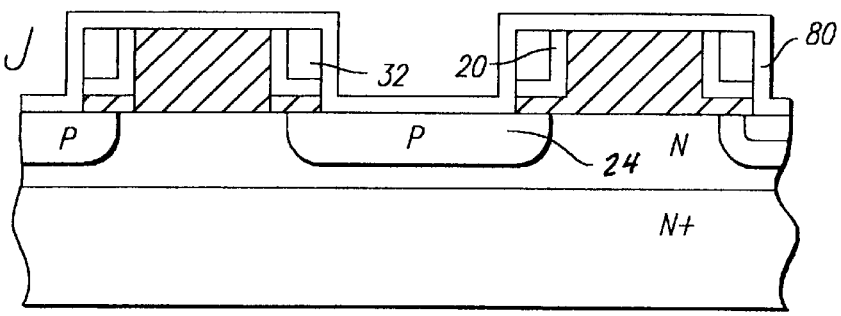

Referring to FIG. 4J, the next stage in the process flow is illustrated. In this step a thin metal layer 80 is deposited. Metal layer 80 may be composed of titanium, molybdenum, nickel or other suitable metal known in the art to form suicides with desirable conductive properties. Layer 80 may be deposited in a conventional manner as known in the art.

Figure 4K:
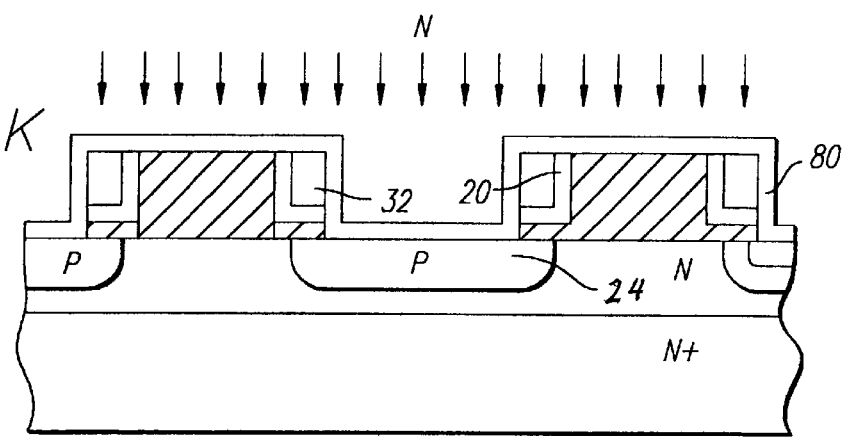

Referring to FIG. 4K, the metal layer 80 is implanted as illustrated by the vertical lines in FIG. 4K. For example, in the case of an N type drain, arsenic may be implanted in the range of from approximately $10^{19}$–$10^{21}$ cm$^{-3}$. (In the case of a P channel device, a similarly high concentration P type implant, e.g., of boron, will be provided in the metal layer 80.)

Figure 4L:
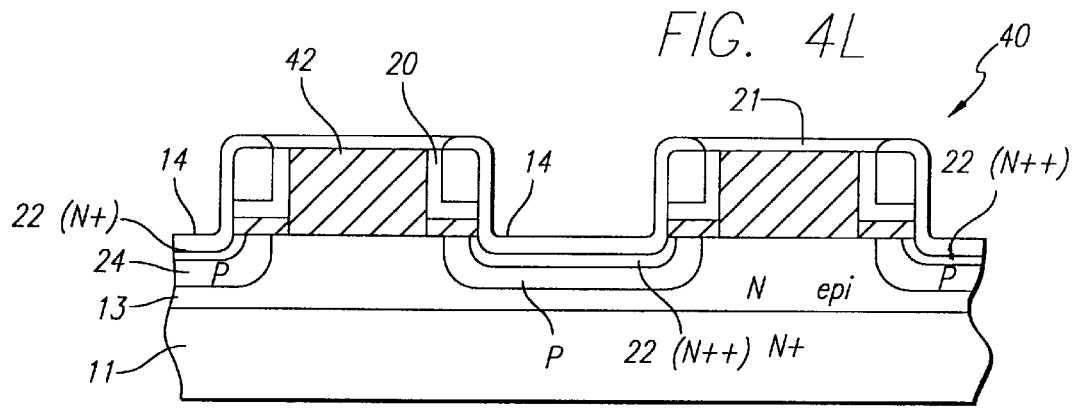

Referring to FIG. 4L, the next step in the process flow of the present invention is shown. The method proceeds with a rapid thermal-processing step which converts the metal layer 80 to silicide (e.g., TiSi) wherever it is in contact with silicon. The portion 21 of the metal layer which is not in contact with silicon is not converted to silicide. For example, the rapid thermal processing (RTP) step may proceed at a temperature of about 600–700° C. for a short period so that the conversion process is complete. The resulting converted metal is illustrated in FIG. 4L as drain contact 14 which may be wholly or partly converted to silicide. Also, during the silicide formation a portion of the underlying drain contact 14 is converted into the silicide forming an integrated substrate/silicide contact. Furthermore, the RTP processing causes dopant to diffuse into the substrate forming shallow drain region 22. This very shallow drain region provides a very precise definition of the edge of the channel region which has a width W, e.g., from about 200–1,500 Å.

Figure 4M:
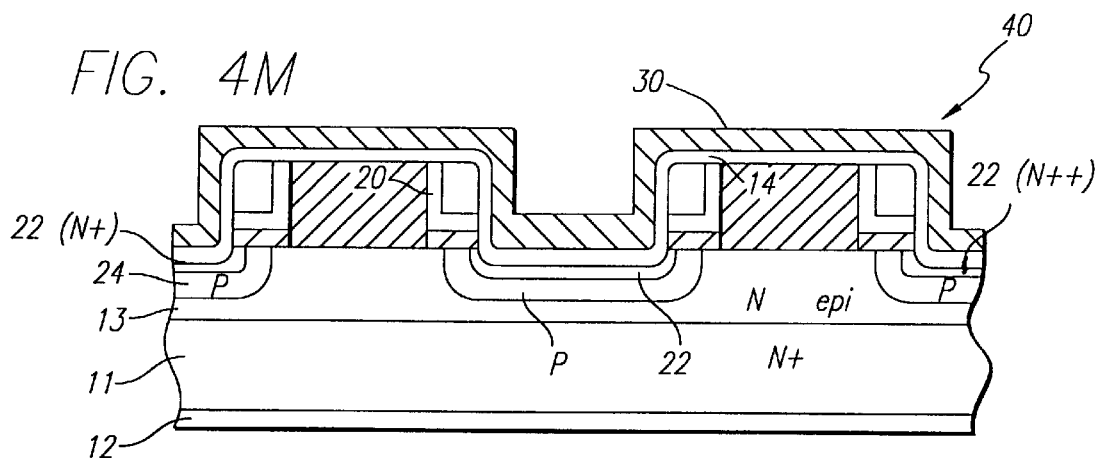

The process flow differs at this point depending upon the rectifier device being manufactured, i.e., whether the device illustrated in FIGS. 1A–1D or the device of FIGS. 2A–2C is to be fabricated by the process illustrated. For the processing of device 40 the process proceeds as shown in FIG. 4M with conventional steps of formation of a barrier metal layer 30, e.g., TiNi, on top of the layer 14. The remainder of device 40 is then formed by conventional methods including a masking step for individual chip contact metallization, thinning of the substrate 11, and formation of source contact 12.

In accordance with the process flow of the fabrication of the device 10, the method proceeds to the step illustrated in FIG. 4M after the RTP processing of layer 80. During the RTP step the open top portions of the pedestals 42 have the SiO$_2$ surface of the pedestals exposed which inhibits the formation of the TiSi. Then the portion of metal layer 80 over the pedestal regions 42, i.e., the Ti which has not been converted to titanium silicide, is etched away exposing the underlying SiO$_2$ pedestal. This is followed by a selective SiO$_2$ etch, e.g., of HF, which etches the SiO$_2$ pedestals 42 down to the underlying silicon of the epitaxial layer 13. The resulting structure has the former pedestal region now being opened down to the underlying silicon with the remainder covered by the drain and gate metallization layer 14 (i.e., the residual portion of TiSi layer 80).

Figure 4N:
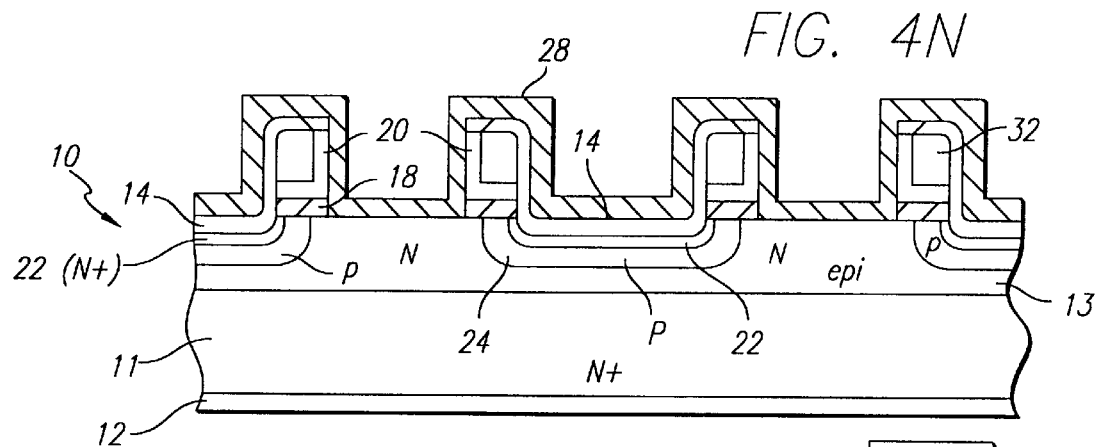

Next, the process flow proceeds to the deposition of a Schottky barrier metal layer 28 as illustrated in FIG. 4N. Metallization layer 28 is chosen to provide the desired Schottky barrier voltage; for example, it may be composed of molybdenum, aluminum, platinum, etc. or a combination of metals chosen to provide the desired barrier height with silicon as is known in the art. The deposition of the Schottky barrier metal layer 28 is followed by a second thermal processing step, for example, a rapid thermal processing step, to form the Schottky barrier at the bottom of the open pedestal regions (i.e., regions 26 illustrated in FIG. 1A). The process flow then proceeds to deposit a conventional TiNi layer or other barrier layer (not shown) over the layer 28 and proceeds with conventional metallization and passivation steps. This is followed by a chip metallization masking and deposition step, thinning of the substrate 11 and formation of the source contact 12, as in the case of formation of device 40.

It will be appreciated by those skilled in the art that the above process flow provides significant advantages both in the cost of the overall process, and hence cost of the devices made thereby. In particular, the described process flow only requires two masking steps, i.e., for formation of the pedestal regions 42 and for the chip metallization, which provides significant cost advantages over multi-step processes employed for formation of the power MOSFET devices employed in synchronous rectifier applications. Also, the process ensures repeatability of device characteristics and hence good yield. Furthermore, it will be appreciated that the method as illustrated provides the ability to provide a very small channel width and allows a large number of active cells on the device surface since submicron device channel geometries may be provided making it possible to provide up to 100 million active regions/cm$^2$ on an integrated circuit chip. This provides low $V_f$ and low on resistance. For example, a $V_f$ of about 0.1–0.5 volts may be provided. Further advantages of the above-described process will be appreciated by those skilled in the art.

Figure 5A:
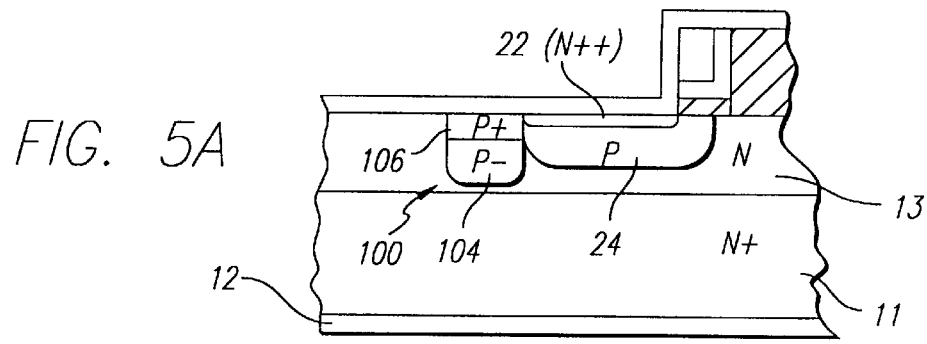
FIGS. 5A and 5B are side sectional and top views, respectively, of an edge portion of the integrated circuit chip of the rectifier device of the present invention illustrating a guard ring structure adjacent the contact pads.
Figure 5B:
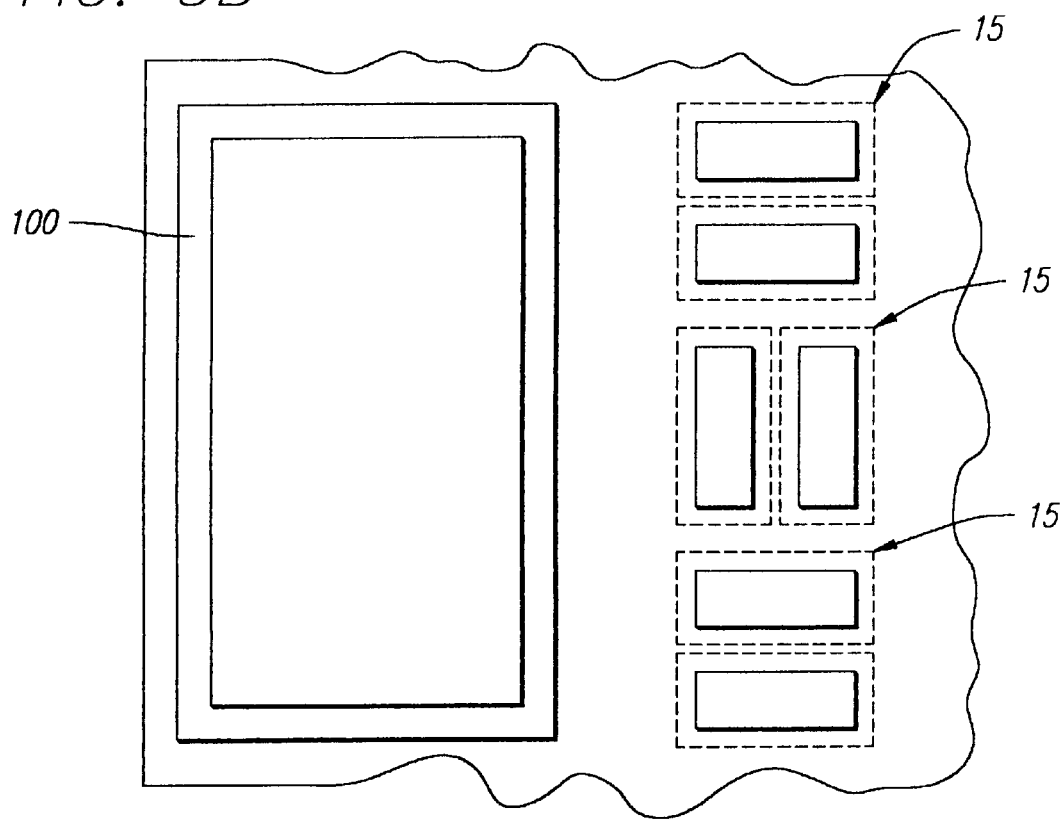

Referring to FIGS. 5A and 5B, a further aspect of the present invention is illustrated corresponding to a guard ring configuration surrounding the electrical contact pads to the integrated circuit chip. The region of the integrated circuit illustrated in FIGS. 5A and 5B corresponds to an edge portion of the integrated circuit. Depending upon the particular voltage and current ranges for the particular application of the rectifier the guard ring may be necessary.

More specifically, referring to FIGS. 5A and 5B, an annular shaped guard ring 100 is formed. For example, the guard ring 100 may be a round, square or rectangular annular shape. As generally illustrated in FIG. 5B, the guard ring 100 will generally be. dimensioned larger than the individual cells of the active portion of the device and, for example, may be from about 3–10 microns along one side of the guard ring, with, for example, about five microns being presently preferred. The guard ring 100 is preferably formed of a relatively deep P– region 104 in the case of N channel active devices (or N– region in the case of P channel active devices). For example, a boron implant of about $10^{15}$–$10^{16}$ cm$^{-3}$ with a depth of about 2,000–10,000 Å may be employed. A shallower P+ contact region 106 is formed on top of the P– region 104 to provide good ohmic contact with the metallization layer. For example, the P+ contact region 106 may comprise a boron implant with a concentration of about $10^{18}$–$10^{19}$ cm$^{-3}$.

As further illustrated in FIG. 5B, the guard ring implants 104 and 106 preferably abut against the body regions 24 of the adjacent cells 15 such that the guard ring in effect provides an extension of the body regions 24 of the cells. In this way, the relatively diffuse region 104 provides a low field blocking junction with the epitaxial region 13 adjacent the edge portion of the integrated circuit chip and the contacts 102, which region is most susceptible to breakdown. Accordingly, it will be appreciated that the guard ring structure illustrated in FIGS. 5A and 5B provides significant advantages in reducing undesired breakdown of the parasitic diodes present in the active cells of the power rectifier of the present invention.

Figure 6B:
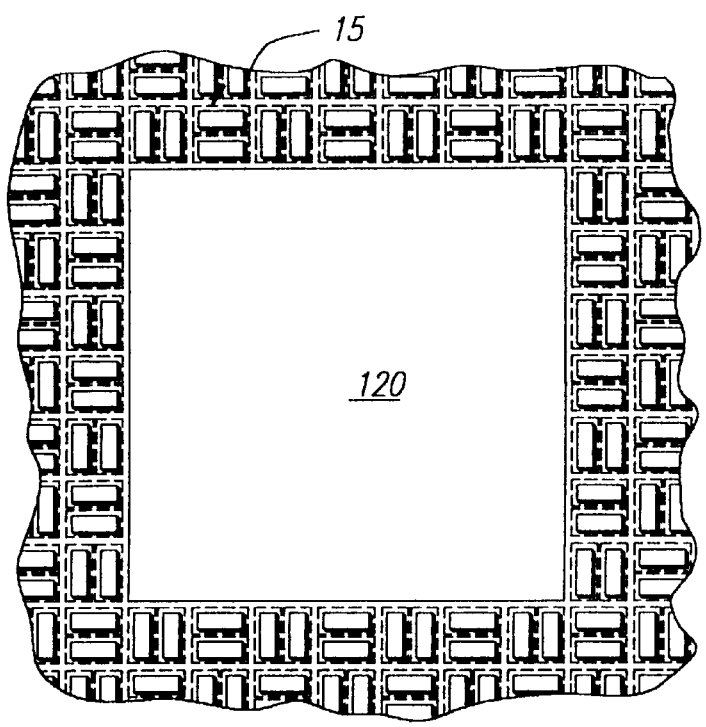
FIGS. 6A and 6B are side sectional and top views, respectively, of a central portion of the rectifier device illustrating a plug region in a further aspect of the present invention.
Figure 6A:
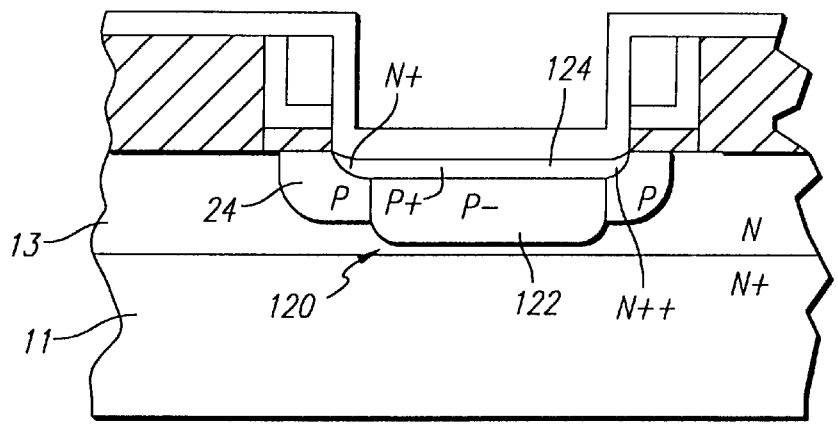

Referring to FIGS. 6A and 6B, a further aspect of the present invention is illustrated employing a plurality of plug regions 120 incorporated throughout the upper surface of the device. The plug regions 120 are provided to ensure that the active body regions 24 of the cells of the power rectifier are electrically at the same potential as the N type regions so that they do not "float". As is known in the art the presence of such floating regions can cause detrimental and unpredictable effects such as variations in switching speed or even failure of cells to switch off or on. Since the majority of the entire surface of the device is utilized as an active area, it is preferable to distribute such plugs 120 over the entire surface more or less evenly. Such a distribution provides similar resistive paths for the bleeding of charges preventing formation of areas of floating potentials. For example, the plug regions 120 may comprise approximately 1–10% of the total surface area of the device and as illustrated in FIG. 6B are situated so that the outer perimeter of the plug regions 120 are surrounded by a number of active cells 15. While a number of individual cells 15 are illustrated around the perimetry of a single plug region 120, this illustration is nonetheless not meant to be to scale and, for example, 100 active cells 15 or more may be configured about an individual plug region 120. For example, the presently preferred side dimensions of a plug region 120 may be about 30 microns. Also, while a square plug region 120 is illustrated in FIG. 6B other geometries may also be employed, for example, elongated rectangular regions or other multi-sided plug regions 120 may be employed.

The plug regions 120 may preferably comprise a relatively deep P– region 122 and a shallower P+ region 124 similarly to the two regions discussed above in relation to the guard ring structure of FIGS. 5A and 5B. For example, the P– region 122 may comprise a 2,000–10,000 Å deep boron implant of about $10^{15}$–$10^{16}$ cm$^{-3}$ for an N channel device region, while shallow P+ region 124 may comprise a shallow boron implant of about $10^{18}$–$10^{19}$ cm$^{-3}$. As is also shown the P+ implants for the plug regions 120 preferably are integral with the P type body regions 24 of the adjacent active cells as well as the contact regions 22 to ensure that all of these regions are held at the same potential to prevent floating of an isolated region to a different electrical potential.

Preferably, the plug regions 120 and the guard rings 100 are provided with a single masking step to define the P– and P+ implants which masking and implant steps precede the pedestal formation step described above in relation to FIG. 4B. This single masking step for both the plug regions and the guard rings provides a significant cost savings in the manufacture of the device since it eliminates a masking step which would increase the total masking steps of the process from 3 to 4. Since the mask formation is a significant percentage of the cost of manufacturing the device it will be appreciated that this provides a significant cost savings; e.g., as much as 20–25% of the cost of manufacturing the device. Also, the throughput of the process is increased since the additional masking step would entail additional time which would slow down the overall processing time for a given batch of wafers Accordingly, it will be appreciated that the present invention provides a power rectifier device and method of manufacture of rectifier devices which provide significant advantages over the prior art. In particular, such advantages include low on resistance, low forward voltage $V_f$, fast recovery time, and good reliability in the electrical characteristics of the device and hence good yield.

Figure 7:
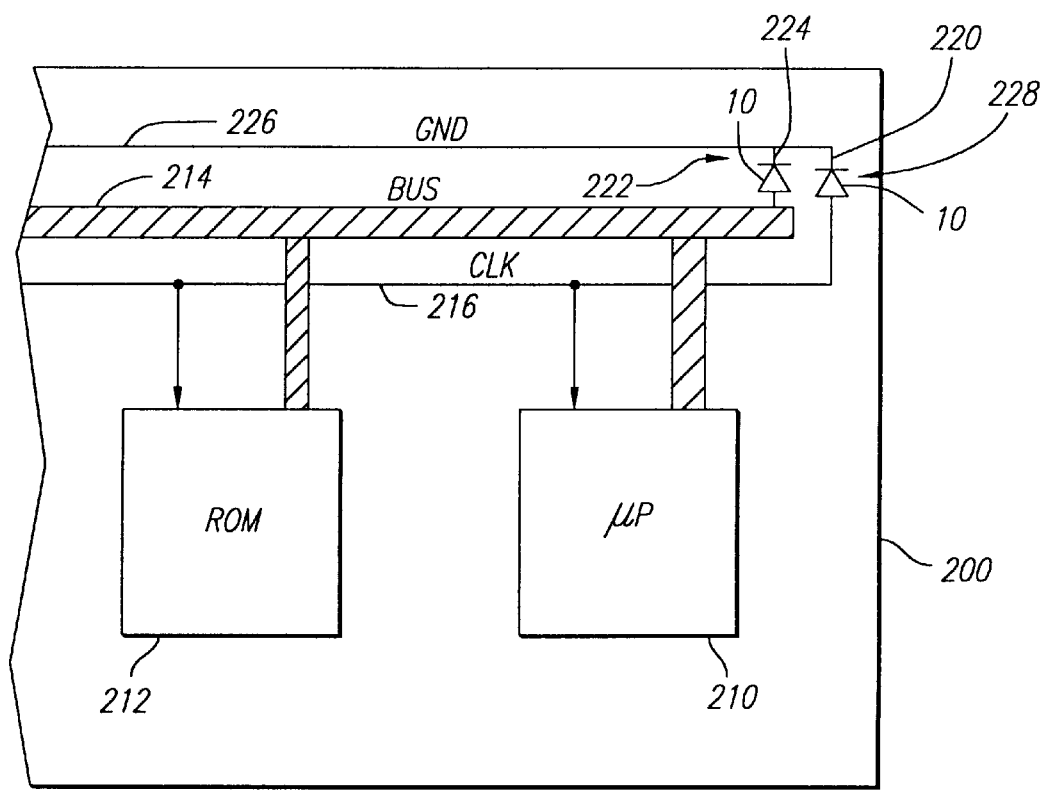
FIG. 7 is a schematic drawing showing a computer motherboard employing a clamping circuit in accordance with the present invention.

Referring to FIG. 7, a computer motherboard employing a clamping circuit in accordance with a further aspect of the present invention is illustrated. The motherboard includes a circuit board 200 on which are mounted computer circuitry including a processor 210 along with other conventional components such as a memory, illustrated as ROM 212, and other conventional circuitry (not shown) varying with the particular computer. A bus line 214 and a clock line 216 are also shown, coupled to the circuitry. In a current high performance PC, for example, the lines 214, 216 may propagate low voltage signals, e.g., 1–3 volts, which operate at frequencies in the GHZ range. These signals can thus generate RF radiation, particularly at the end portions of the lines. To reduce or eliminate this radiation a clamping circuit is provided for the bus line and the clock line adjacent their termination portions. In particular, a bus clamping circuit 222 comprises a rectifier 10 (or 40), according to one of the above described embodiments, coupled via conductive lead 224 to ground line 226. Similarly, clock line clamping circuit 228 comprises a rectifier 10 (or 40) coupled via lead 220 to ground line 226. Due to the high speed and very low $V_f$ characteristics of the rectifiers 10,40, these clamping circuits can effectively clamp the clock and bus line signals to ground, despite the high speed and low operating voltage levels of these signals, effectively reducing or eliminating RF radiation from these lines. It will be appreciated by those skilled in the art that more elaborate clamping circuits may be provided employing rectifiers 10, 40 for such alternate clamping circuit designs and such alternate designs are within the scope of the present invention.

It should be appreciated that the above-described description of the preferred embodiment is merely illustrative in nature and a variety of modifications to both the device structure and the process flow may be provided while remaining within the scope of the present invention. Also, although detailed features and ranges described above may be described as preferred, advantageous, etc., such detailed features and ranges should not be viewed as essential or critical elements of the present invention unless specifically so stated.

What is claimed is:

1. A method of fabricating a rectifier device, comprising the steps of:

providing a silicon semiconductor substrate;

forming a plurality of pedestals on the top surface of said semiconductor substrate;

forming a gate oxide on said semiconductor substrate adjacent the pedestals;

forming a first spacer adjacent the pedestal sidewalls;

performing a first implant into said semiconductor substrate of a dopant of a first conductivity type, the implant being laterally defined by said first spacer;

removing said first spacer;

forming a conductive gate layer on said gate oxide layer;

forming a second spacer on said gate layer adjacent said conductive pedestal sidewalls;

etching said first metal layer to expose said semiconductor substrate between adjacent spacers;

depositing a layer of a metal which forms a silicide with silicon over said second spacer and exposed substrate;

performing a second implant of a dopant of a second conductivity type, said second implant being laterally defined by said second spacer and penetrating said metal layer;

thermally processing said semiconductor substrate at a temperature sufficient to convert at least a portion of said metal layer over said semiconductor substrate to a silicide and diffuse some of said dopant of said second conductivity type from said metal layer into said semiconductor substrate to form a shallow drain region;

wherein said first and second implants and said thermal processing step define a plurality of channel regions adjacent said pedestals and below said gate oxide; and forming first and second electrically conductive contact layers on said top and bottom surfaces, respectively, to provide a current flow path between said surfaces.

2. A method as set out in claim 1, wherein said first spacer is polysilicon.

3. A method as set out in claim 2, wherein the act of removing said first spacer comprises a selective polysilicon etching step.

4. A method as set out in claim 1, wherein said second spacer is formed of doped polysilicon.

5. A method as set out in claim 1, wherein said gate layer is a metal layer from 100–250 Å thick.

6. A method as set out in claim 1, wherein said metal layer is about 100–200 Å thick.

7. A method as set out in claim 1, wherein the act of etching said gate layer further comprises etching the exposed horizontal portion of said gate oxide between spacers to the underlying semiconductor substrate.

8. A method as set out in claim 1, wherein said thermal processing comprises rapid thermal processing.

9. A method as in claim 1, wherein said first dopant is boron and said second dopant is arsenic.

10. A method as in claim 1, wherein said metal layer is composed of molybdenum, titanium or nickel.

11. A method set out in claim 1, wherein said second spacer is composed of polysilicon.

12. A method as set out in claim 11, wherein said thermally processing the metal layer further comprises forming forming a silicide on the exposed surfaces of said polysilicon second spacer.

13. A method as set out in claim 1, wherein said pedestal formation comprises spacing said pedestals a distance of about 0.25–0.5 microns apart.

14. A method as set out in claim 1, further comprising, prior to said step of pedestal formation, forming a plurality of plug implants and guard ring implants of said first conductivity type in respective plug and guard ring regions.

15. A method as set out in claim 14, wherein said plug and guard ring implant provide peak concentrations of about $10^{15}$–$10^{16}$ cm$^{-3}$.

16. A method as in claim 14, wherein a single mask is employed to form said plug and guard ring regions.

17. A method as set out in claim 14, wherein said plug and guard ring implant further comprise a shallow implant of about $10^{17}$–$10^{19}$ cm$^{-3}$.

18. A method as set out in claim 1, further comprising the steps of:

providing one or more intermediate removable spacers; and providing additional implants of the dopant of the first conductivity type for the purpose of specific shaping of the resulting p/n junction.

\* \* \* \* \*